(12) United States Patent
Takeshima

(10) Patent No.: US 11,615,530 B2
(45) Date of Patent: Mar. 28, 2023

(54) MEDICAL DATA PROCESSING APPARATUS FOR RECONSTRUCTING A MEDICAL IMAGE USING A NEURAL NETWORK

(71) Applicant: Canon Medical Systems Corporation, Otawara (JP)

(72) Inventor: Hidenori Takeshima, Kawasaki (JP)

(73) Assignee: Canon Medical Systems Corporation, Otawara (JP)

( * ) Notice: Subject to any disclaimer, the term of this patent is extended or adjusted under 35 U.S.C. 154(b) by 205 days.

(21) Appl. No.: 17/082,114

(22) Filed: Oct. 28, 2020

(65) Prior Publication Data

US 2021/0174501 A1 Jun. 10, 2021

(30) Foreign Application Priority Data

Dec. 4, 2019 (JP) .............................. JP2019-219788

(51) Int. Cl.
*G06T 7/00* (2017.01)
*G06T 5/50* (2006.01)
*G01R 33/56* (2006.01)

(52) U.S. Cl.
CPC ........ *G06T 7/0012* (2013.01); *G01R 33/5608* (2013.01); *G06T 5/50* (2013.01); *G06T 2207/10088* (2013.01); *G06T 2207/20081* (2013.01)

(58) Field of Classification Search
CPC ................... G06T 7/0012; G06T 5/50; G06T 2207/10088; G06T 2207/20081; G06T 2207/20084; G06T 2207/20216; G01R 33/5608
See application file for complete search history.

(56) References Cited

U.S. PATENT DOCUMENTS

2019/0150857 A1 5/2019 Nye et al.
2019/0336033 A1 11/2019 Takeshima

FOREIGN PATENT DOCUMENTS

WO WO 2017/031088 A1 2/2017

OTHER PUBLICATIONS

Ophir Gozes and Hayit Greenspan: "Lung Structures Enhancement in Chest Radiographs via CT based FCNN Training", Oct. 14, 2018. (Year: 2018).*
Imai, H. et al., "SNR measurement of Parallel MRI images by difference map method and continuous imaging method," Journal of Japanese Society of Radiology Technology, vol. 64, No. 8, 2008, 15 pages (with English translation).

* cited by examiner

*Primary Examiner* — Siamak Harandi
(74) *Attorney, Agent, or Firm* — Oblon, McClelland, Maier & Neustadt, L.L.P.

(57) ABSTRACT

A medical image processing apparatus includes processing circuitry. The processing circuitry generates a plurality of first medical images by applying a plurality of first machine learning models having different elements to a set of raw data, or applying a first machine learning model to a set of raw data a plurality of times while changing elements. The processing circuitry outputs a second medical image and a first reliability relating to the second medical image based on the first medical images.

13 Claims, 10 Drawing Sheets

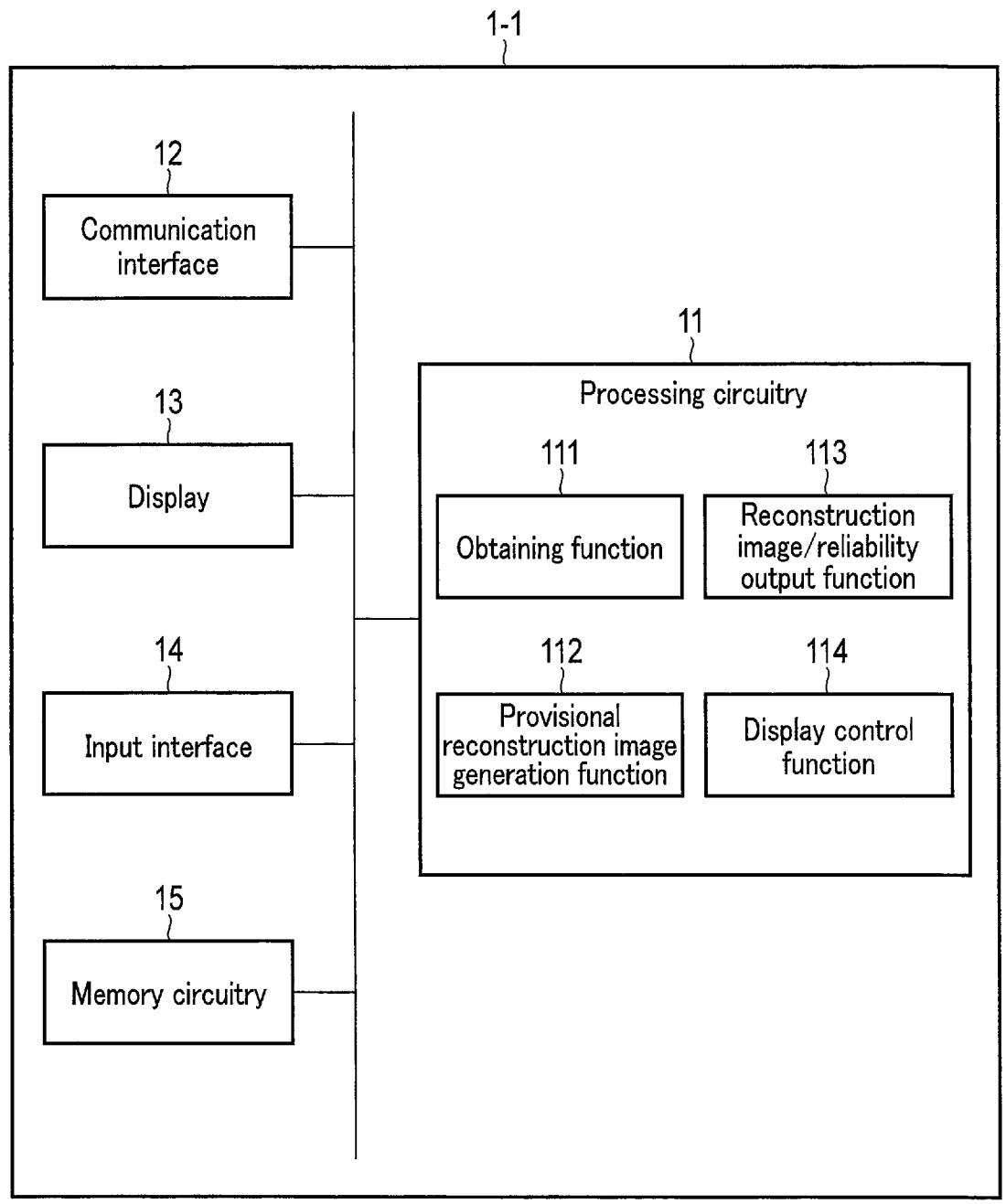
F I G. 1

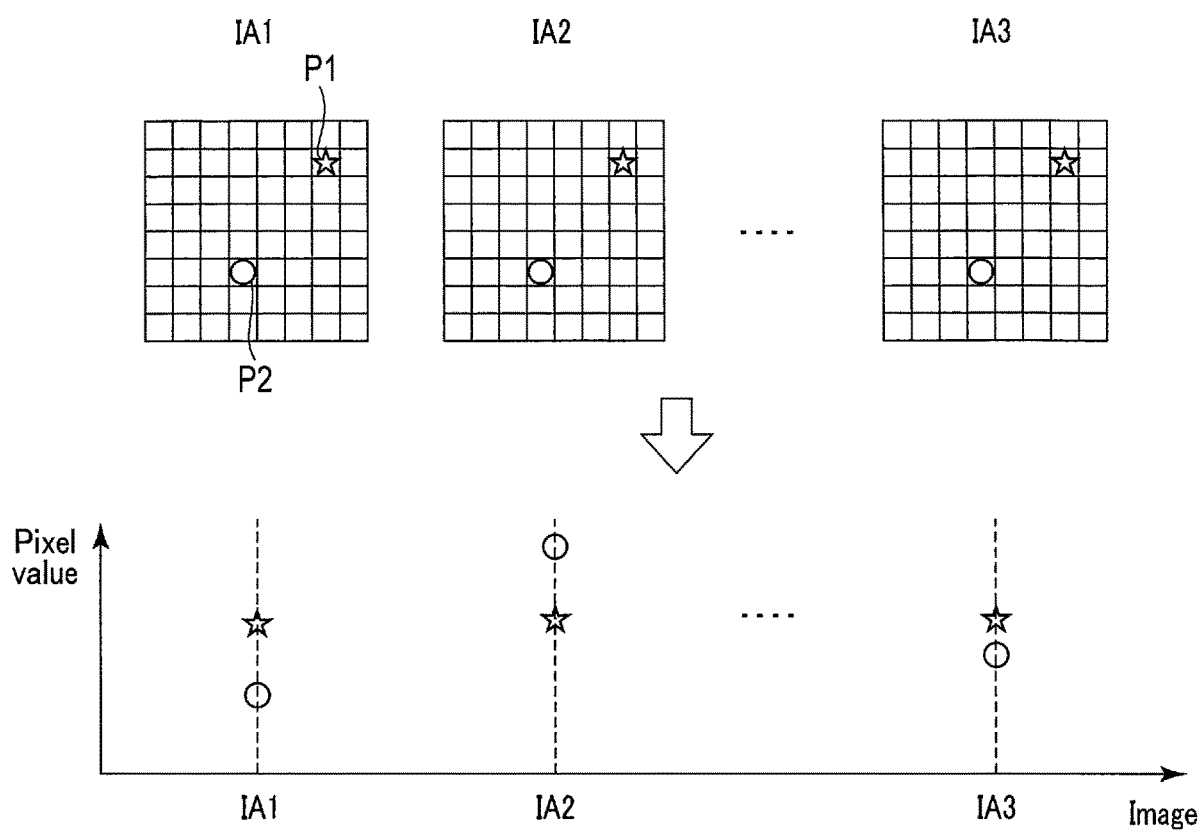
F I G. 6

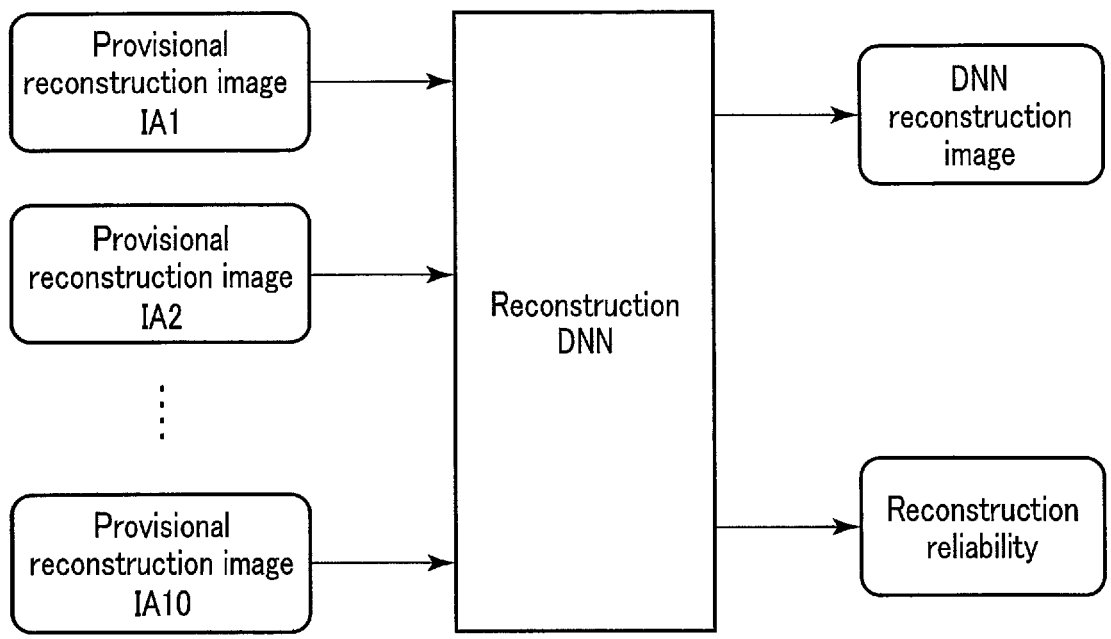
F I G. 7
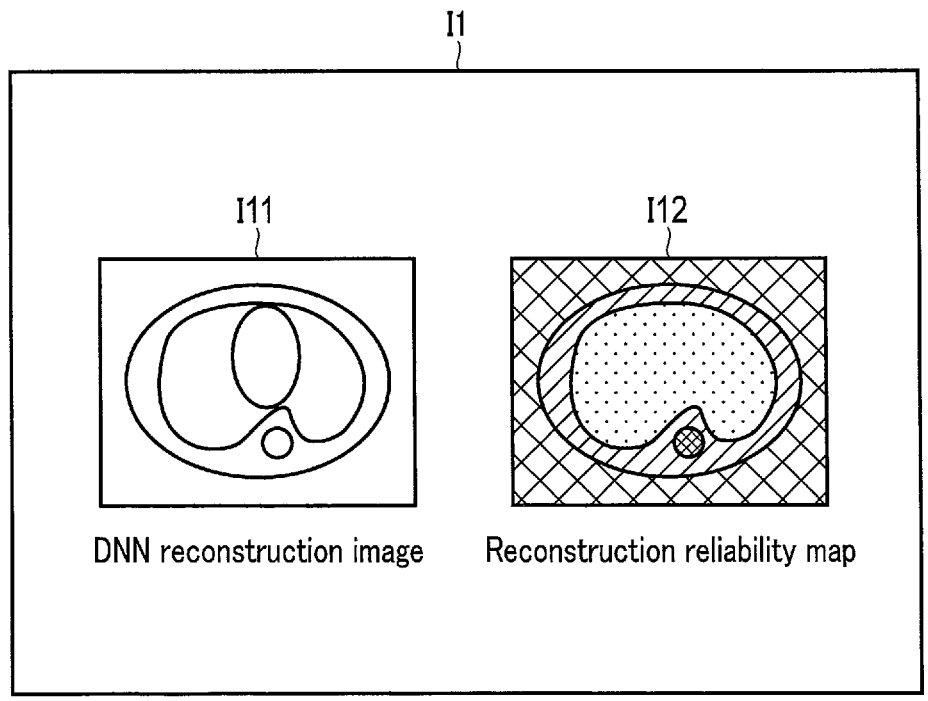
F I G. 8

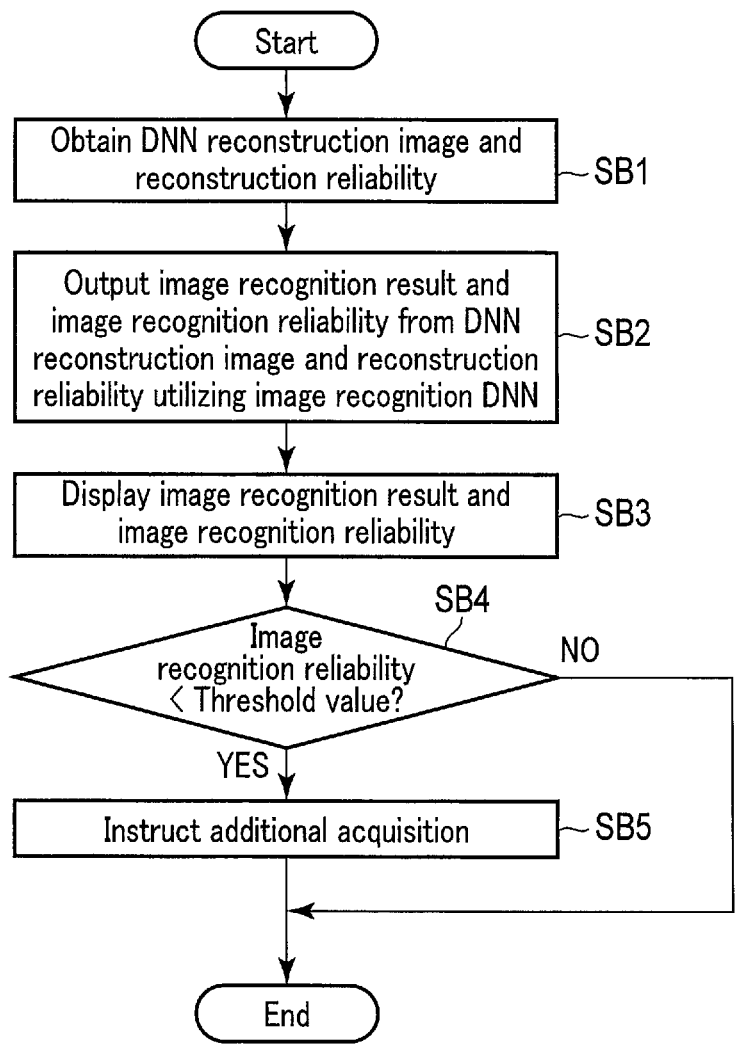
F I G. 12

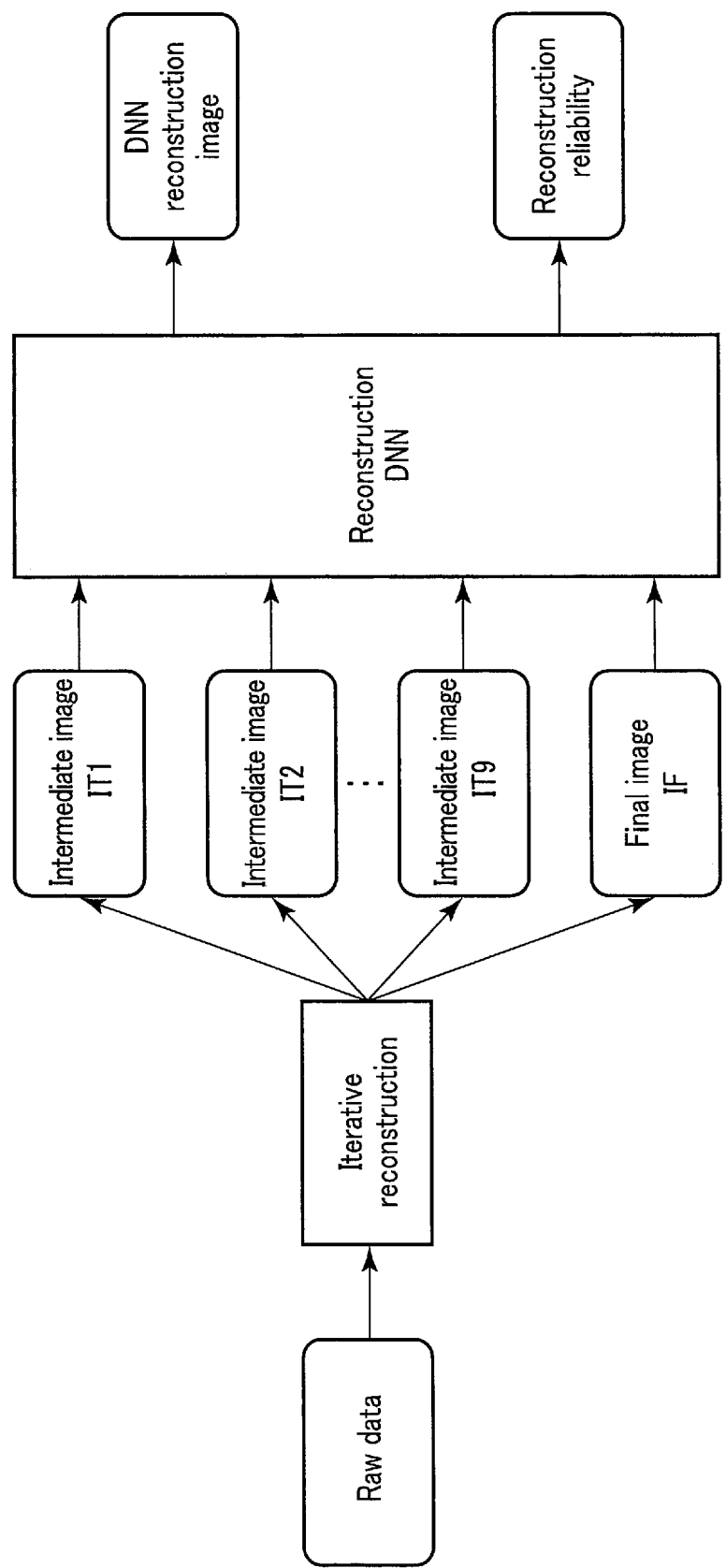
F I G. 14

MEDICAL DATA PROCESSING APPARATUS FOR RECONSTRUCTING A MEDICAL IMAGE USING A NEURAL NETWORK

CROSS-REFERENCE TO RELATED APPLICATIONS

This application is based upon and claims the benefit of priority from the Japanese Patent Application No. 2019-219788, filed Dec. 4, 2019, the entire contents of which are incorporated herein by reference.

FIELD

Embodiments described herein relate generally to a medical data processing apparatus.

BACKGROUND

In the field of medical image diagnoses, a method of reconstructing a medical image from raw data utilizing a deep neural network (DNN) (DNN reconstruction) has been proposed. However, a method of measuring a reliability of a medical image generated by DNN reconstruction has not been established. Thus, it is unclear to what extent the medical image is reliable.

BRIEF DESCRIPTION OF THE DRAWINGS

FIG. 1 is a diagram showing a configuration of a medical data processing apparatus according to a first embodiment.

FIG. 6 is a diagram for explaining an idea of the reconstruction reliability.

FIG. 7 is a schematic diagram showing a second output method for outputting a DNN reconstruction image and a reconstruction reliability used in step SA3 illustrated in FIG. 2.

FIG. 8 is a diagram showing an example of a display screen including a DNN reconstruction image and a reconstruction reliability map.

FIG. 12 is a diagram showing a typical flow of reconstruction reliability utilizing processing performed by processing circuitry according to the second embodiment.

FIG. 14 is a drawing schematically showing a flow of DNN reconstruction processing according to a modification.

DETAILED DESCRIPTION

Figure 2:
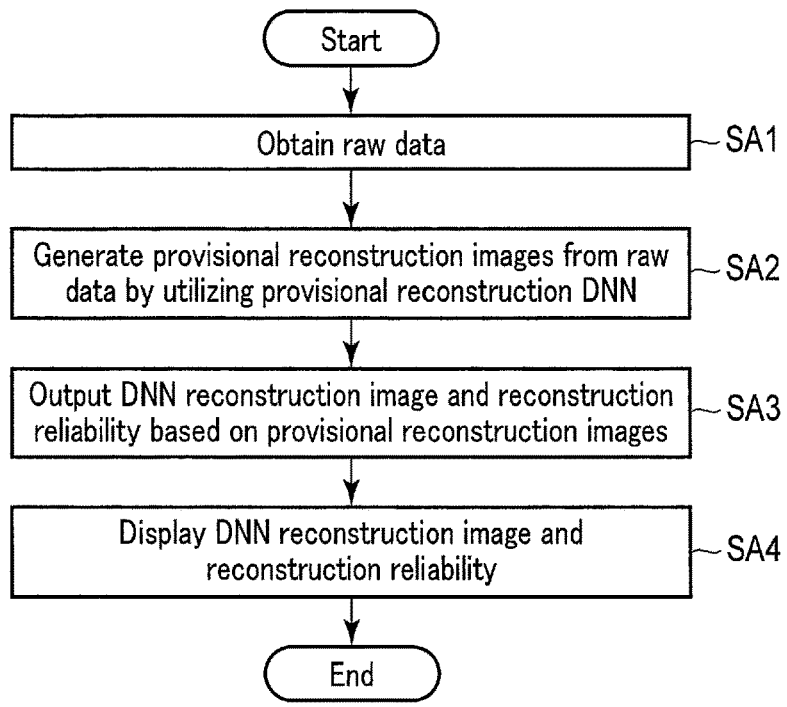
FIG. 2 is a diagram showing a typical flow of DNN reconstruction processing performed by processing circuitry according to the first embodiment.

In general, according to one embodiment, a medical data processing apparatus includes processing circuitry.

The processing circuitry generates a plurality of first medical images by applying a plurality of first machine learning models having different elements to a set of raw data, or applying a first machine learning model to a set of raw data a plurality of times while changing elements.

The processing circuitry outputs a second medical image and a first reliability relating to the second medical image based on the first medical images.

The medical data processing apparatus according to the present embodiment will be explained with reference to the accompanying drawings.

The medical data processing apparatus according to the present embodiment corresponds to a computer configured to process medical data. Medical data corresponds to raw data or medical image data acquired by a medical apparatus. The medical apparatus is, for example, a medical image diagnostic apparatus. The medical image diagnostic apparatus may be a single-modality apparatus or a composite-modality apparatus. Examples of the single-modality apparatus include an X-ray computed tomography apparatus (X-ray CT apparatus), a magnetic resonance imaging apparatus (MRI apparatus), an X-ray diagnostic apparatus, a positron emission tomography (PET) apparatus, a single photon emission CT (SPECT) apparatus, an ultrasonic diagnostic apparatus, an optical interference tomography apparatus (a fundus camera), and an optical ultrasonic diagnostic apparatus. Examples of the composite-modality apparatus include a PET/CT apparatus, a SPECT/CT apparatus, a PET/MRI apparatus, and a SPECT/MRI apparatus. Alternatively, the medical apparatus may be an optical camera apparatus utilized secondarily together with a medical image diagnostic apparatus, or an optical camera apparatus attached to a catheter.

When the medical image diagnostic apparatus is an X-ray CT apparatus, a gantry of the X-ray CT apparatus applies X-rays to a subject from an X-ray tube while rotating the X-ray tube and an X-ray detector around the subject, and detects by the X-ray detector the X-rays passed through the subject. In the X-ray detector, an electric signal having a wave-height value corresponding to the detected X-ray dose is generated. This electric signal is subjected to signal processing such as A/D conversion by data acquisition circuitry. The A/D converted electric signal is referred to as projection data or sinogram data. The projection data or sinogram data is a type of raw data.

When the medical image diagnostic apparatus is an MRI apparatus, a gantry of the MRI apparatus repeats application of the gradient field by way of a gradient field coil and application of RF pulses by way of a transmission coil under the application of the static field by way of a static field magnet. An MR signal from the subject is released in response to the application of the RF pulses. The released MR signal is received by way of a reception coil. The received MR signal is subjected to signal processing such as A/D conversion by the reception circuitry. The A/D converted MR signal is referred to as k-space data. The k-space data is a type of raw data.

When the medical image diagnostic apparatus is an ultrasonic diagnostic apparatus, an ultrasonic probe of the ultrasonic diagnostic apparatus transmits ultrasonic beams from a plurality of ultrasonic transducers into the subject body, and receives the ultrasonic waves reflected from the subject body by way of the ultrasonic transducers. The ultrasonic transducers generate an electric signal having a wave-height value corresponding to the sound pressure of the received ultrasonic waves. The electric signal is subjected to the A/D conversion by the A/D converter provided in the ultrasonic probe or the like. The A/D converted electric signal is referred to as echo data. The echo data is a type of raw data.

When the medical image diagnostic apparatus is a PET apparatus, a gantry of the PET apparatus simultaneously counts by coincidence circuitry a pair of gamma rays with 511 keV, which are generated in accordance with the annihilation of positrons generated from radionuclides accumulated in the subject and electrons around the radionuclide, thereby generating digital data having digital values indicative of the energy value and detection position of the pair of gamma rays. This digital data is referred to as coincidence data or sinogram data. The coincidence data or sinogram data is a type of raw data.

When the medical image diagnostic apparatus is an X-ray diagnostic apparatus, The X-rays is generated from the X-ray tube provided in the C-arm. The X-rays produced by the X-ray tube and transmitted through the subject are received by the X-ray detector such as a flat panel display (FPD) arranged in the C-arm or arranged separately from the C-arm. The X-ray detector generates an electric signal having a wave-height value corresponding to the detected X-ray dose, and performs signal processing such as A/D conversion on this electric signal. The A/D converted electric signal is referred to as projection data or X-ray image data. In the case of a cone beam CT or the like, the projection data or X-ray image data may be used as raw data. Therefore, the projection data or X-ray image data is a type of raw data.

According to the present embodiment, the raw data is not limited to original raw data acquired by the medical image diagnostic apparatus. For example, the raw data may be computational raw data that is generated by performing inverse conversion processing on medical image data. When raw data is acquired by the X-ray CT apparatus, the inverse conversion processing corresponds to, e.g., forward projection processing. When medical raw data is acquired by the MRI apparatus, the inverse conversion processing corresponds to, e.g., Fourier transformation processing. Furthermore, the raw data of the embodiment may be raw data generated by processing original raw data with various data processing. The aforementioned various data processing may be any processing, such as noise reduction processing, data compression processing, data interpolation processing resolution synthesis processing, and super-resolution processing.

First Embodiment

FIG. 1 is a diagram showing a configuration of a medical data processing apparatus 1-1 according to the first embodiment. The medical data processing apparatus 1-1 may be a computer included in the medical apparatus or a computer separate from the medical apparatus.

As shown in FIG. 1, the medical data processing apparatus 1-1 includes processing circuitry 11, a communication interface 12, a display 13, an input interface 14, and a memory circuitry 15.

The processing circuitry 11 includes a processor such as a CPU or GPU. By activating various programs installed in the memory circuitry 15, etc., the processor implements an obtaining function 111, a provisional reconstruction image generation function 112, a reconstruction image/reliability output function 113, a display control function 114, etc. Each of the functions 111 to 114 are not limited to those realized by single processing circuitry. Processing circuitry may be configured by combining a plurality of independent processors that execute respective programs to implement the respective functions 111 to 114.

By implementing the obtaining function 111, the processing circuitry 11 obtains a set of raw data relating to the subject. For example, the processing circuitry 11 obtains raw data from the medical apparatus. The processing circuitry 11 may obtain the raw data from the memory circuitry 15 storing the raw data obtained by way of the communication interface 12, a portable recording medium, or the like. A set of raw data of a target of treatment according to the present embodiment is an aggregate of raw data that falls within a range of data necessary for image reconstruction. For example, when raw data is projection data that is acquired by an X-ray computed tomography apparatus, a set of raw data of the target of treatment includes projection data of the number of views per rotation of a rotation frame. When raw data is k-space data to be acquired by a magnetic resonance imaging apparatus, a set of raw data of the target of treatment includes k-space data corresponding to the number and/or range of k-space trajectories necessary for filling up one k-space.

By implementing the provisional reconstruction image generation function 112, the processing circuitry 11 generates a plurality of first medical images by applying a plurality of first machine learning models having different elements to a set of raw data, or applying a first machine learning model to a set of raw data a plurality of times while changing elements. The first machine learning model is a model trained to output, from a set of raw data as an input, a first medical image corresponding to the set of raw data. The first medical image generated by the provisional reconstruction image generation function 112 is hereinafter also referred to as the provisional reconstruction image. A plurality of generated provisional reconstruction images are medical images based on one common set of raw data; therefore, for example, substantially the same anatomical region of the subject is depicted in the provisional reconstruction images.

The machine learning model is a neural network represented by a composite function that is defined by a combination of a plurality of adjustable elements. The adjustable elements include, for example, elements that constitute a composite function, such as a parameter set or a network architecture. The network architecture is, for example, a system of connection between nodes (neurons). The neural network may be realized by a multi-layer network (deep neural network: DNN) having two or more layers, typically, an input layer, a plurality of hidden layers, and an output layer. The machine learning model may be mounted as a program or may be physically mounted to a processor such as an ASIC.

By implementing the reconstruction image/reliability output function 113, the processing circuitry 11 outputs the second medical image and the first reliability relating to the second medical image based on the first medical images. The first reliability is data relating to the reliability of the second medical image, the data being based on the first medical images. The second medical image output through the reconstruction image/reliability output function 113 is also referred to as a DNN reconstruction image. The first reliability output through the reconstruction image/reliability output function 113 is also referred to as a reconstruction reliability. The DNN reconstruction image is a medical image generated by using a plurality of provisional reconstruction images. For example, the DNN reconstruction image includes an anatomical region of the subject that is substantially the same as that depicted in the provisional reconstruction images. The reconstruction reliability is information corresponding to variations between the provisional reconstruction images.

By implementing the display control function 114, the processing circuitry 11 displays various kinds of information via the display 13. For example, the processing circuitry 11 displays the second medical image (DNN reconstruction image) and the first reliability (reconstruction reliability). The processing circuitry 11 may display one or more first medical images out of the plurality of first medical images. During this display, the processing circuitry 11 may perform any image display processing such as gradation processing or scaling on the medical image. When the medical image is a three-dimensional image, the processing circuitry 11 may convert the medical image into two-dimensional image data by performing three-dimensional image processing thereon. As the three-dimensional image processing, the processing circuitry 11 may perform volume rendering, surface volume rendering, pixel value projection processing, multi-planer reconstruction (MPR) processing, curved MPR (CPR) processing, etc.

The communication interface 12 is an interface connecting the medical apparatus with a workstation, a picture archiving and communication system (PACS), a hospital information system (HIS), a radiology information system (RIS), and the like via a local area network (LAN) or the like. The network IF transmits and receives various kinds of information to and from the connected workstation, PACS, HIS and RIS.

The display 13 displays various kinds of information in accordance with the display control function 114 of the processing circuitry 11. As the display 13, a liquid crystal display (LCD), a cathode ray tube (CRT) display, an organic electroluminescence display (OELD), a plasma display, or any other display may be suitably adopted. The display 13 may be a projector.

The input interface 14 receives various input operations from a user, converts the received input operations into electric signals, and outputs them to the processing circuitry 11. Specifically, the input interface 14 is coupled to an input device such as a mouse, a keyboard, a track ball, a switch, a button, a joystick, a touch pad, and a touch panel display. The input interface 14 outputs to the processing circuitry 11 the electric signals corresponding to the input operations to the input device. Furthermore, the input device connected to the input interface 14 may be an input device provided in a separate computer connected via a network or the like. The input interface 14 may be a speech recognition device configured to convert a speech signal acquired by a microphone to an instruction signal.

The memory circuitry 15 is a storage device for storing various kinds of information, such as a read only memory (ROM), a random access memory (RAM), a hard disk drive (HDD), a solid state drive (SSD), an integrated circuit storage device or the like. The memory circuitry 15 stores, for example, raw data, various kinds of medical images, and various kinds of machine learning models. The memory circuitry 15 may be not only the aforementioned storage device, but also a driver that writes and reads various kinds of information in and from, for example, a portable storage medium such as a compact disc (CD), a digital versatile disc (DVD), or a flash memory, or a semiconductor memory. The memory circuitry 15 may be provided in another computer connected to the medical data processing apparatus 1-1 via a network.

Next, details of the medical data processing apparatus 1-1 according to the first embodiment will be described.

In the following, for detailed explanations, the machine learning model is assumed to be a DNN. The machine learning model that has been trained to output, from a set of raw data as an input, a provisional reconstruction image corresponding to the set of raw data, for use in the provisional reconstruction image generation function 112, is referred to as a provisional reconstruction DNN. Raw data of a target of treatment is assumed to be acquired by a magnetic resonance imaging apparatus. In this case, the raw data of the target of treatment is k-space data.

In the DNN reconstruction processing, the processing circuitry 11 first generates a plurality of provisional reconstruction images based on the set of raw data, and then generates a DNN reconstruction image based on the provisional reconstruction images. The reliability of the DNN reconstruction image thus generated by the DNN reconstruction processing is output. Details of the DNN reconstruction processing according to the first embodiment will be described below.

FIG. 2 is a diagram showing a typical flow of the DNN reconstruction processing performed by the processing circuitry 11 according to the first embodiment.

As shown in FIG. 2, the processing circuitry 11 obtains a set of raw data of the target of treatment (step SA1). For example, the processing circuitry 11 obtains k-space data as the raw data from the magnetic resonance imaging apparatus.

After step SA1 is performed, the processing circuitry 11 generates a plurality of provisional reconstruction images from the raw data obtained in step SA1 by utilizing the machine learning model for provisional reconstruction (provisional reconstruction DNN) (step SA2). There are two types of methods for generating a plurality of provisional reconstruction images. Details of a first generation method and a second generation method will be described below.

Figure 3:
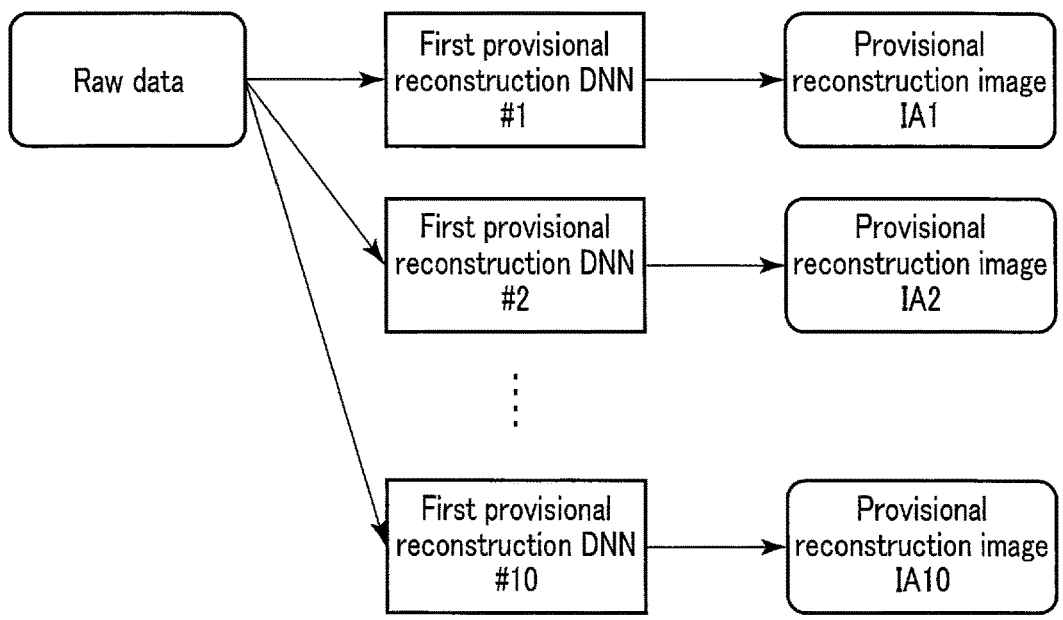
FIG. 3 is a schematic diagram showing a first generation method used in step SA2 illustrated in FIG. 2.

FIG. 3 is a diagram schematically showing the first generation method. As shown in FIG. 3, according to the first generation method, an N number of first provisional reconstruction DNNs #1 to #k (1<k☐N) have been generated in advance. N may be any number that is at least two. For example, in the example shown in FIG. 3, N is 10. Each first provisional reconstruction DNN #k is a DNN trained to output provisional reconstruction images #IAk from a set of raw data of the target of treatment as an input. A plurality of provisional reconstruction images #IAk have different elements from one another. The different elements of the plurality of provisional reconstruction. DNNs #k are one or more elements of the parameter and the network architecture described above.

For example, in the case of N=10, 10 first provisional reconstruction DNNs #1 to #10 are generated in advance, and stored in the memory circuitry 15. By inputting common raw data to the first provisional reconstruction DNNs #1 to #10, 10 first provisional reconstruction images IA1 to IA10 are generated. Although the 10 first provisional reconstruction images IA1 to IA10 are based on the common raw data, they are not completely the same, since they are respectively generated from the 10 first provisional reconstruction DNNs #1 to #10 having different elements from one another. Therefore, a pixel value of one pixel of one image may be different from that of another, with the result that qualities of the images may be different. In particular, with regard to pixels in which reconstruction by the DNN is unstable, pixel values are liable to vary largely over all the provisional reconstruction images IA1 to IA10.

A method for generating a first provisional reconstruction DNN will now be described. The first provisional reconstruction DNN may be generated by the medical data processing apparatus 1-1 or may be generated by any other computer. Hereinafter, a computer including a processor such as a CPU, a GPU, etc., for generating the first provisional reconstruction. DNN will be referred to as a model learning apparatus.

The model learning apparatus generates the first provisional reconstruction DNN by causing one DNN to perform machine learning based a plurality of training samples. The training sample is a combination of raw data as input data and a correct provisional reconstruction image as correct data. The model learning apparatus performs forward propagation processing by applying the DNN to raw data, and outputs a provisional reconstruction image (hereinafter referred to as an estimated provisional reconstruction image). Next, the model learning apparatus performs back propagation processing by applying a difference (loss) between the estimated provisional reconstruction image and the correct provisional reconstruction image to the DNN, and calculates a gradient vector. Subsequently, the model learning apparatus updates parameters of the DNN, such as a weight and a bias, etc., based on the gradient vector. The first provisional reconstruction DNN is generated by repeating the forward propagation processing, the back propagation processing, and the parameter update processing, while changing the training samples.

As the input data of the training sample, k-space data acquired in accordance with any pulse sequence may be used. As the output data of the training sample, an MR image generated by processing the k-space data with conventional image reconstruction, such as an inverse Fourier transformation or an iterative reconstruction, may be used. The input of the training sample may be original k-space data acquired by the magnetic resonance imaging apparatus, or may be k-space data obtained by pre-processing the original k-space data, such as down-sampling.

As the method for varying elements over all the first provisional reconstruction DNNs, various methods are available. For example, in one method, the order of inputting a plurality of training samples to be used into the DNNs is varied. The value of each parameter in the parameter set of a DNN depends on the order of inputting the training samples into the DNN. Even when the same training samples are used, the values of the parameters of a plurality of trained DNNs can be varied by varying the order of inputting the training samples into a plurality of untrained DNNs. For example, the order of inputting the training samples may be determined by random numbers. Specifically, first, the processing circuitry 11 assigns seed values of a plurality of pseudo random numbers to the plurality of untrained DNNs. The processing circuitry 11 generates a sequence of random numbers based on the seed values for the respective untrained DNNs. The number of random numbers included in the sequence corresponds to the number of training samples, and each random number corresponds to the order of inputting the training sample. Thus, the order of inputting the training samples into the untrained DNNs is determined by the sequence of random numbers. The processing circuitry 11 applies the training samples to the untrained DNNs in accordance with the determined input order, thereby determining the values of the parameters of the trained DNNs (first provisional reconstruction DNNs).

Since the values of the parameters of the first provisional reconstruction DNNs are determined in accordance with the different input orders, the values of the parameters can be varied over all first provisional reconstruction DNNs.

As another method for varying elements over the first provisional reconstruction DNNs, a method for varying the order of nodes (neurons) to be erased by dropout (hereinafter referred to as an erasure order) may be adopted. The value of each parameter in the parameter set of a DNN depends on the erasure order. Even when the same training samples are used, the values of the parameters of a plurality of trained DNNs can be varied by varying the erasure order in the dropout for a plurality of untrained DNNs.

For example, the erasure order can be determined by using random numbers. Specifically, first, the processing circuitry 11 sets any arbitrary layer to which the dropout is to be applied, out of a plurality of layers included in the untrained DNN. The layer to which the dropout is to be applied is not particularly limited. The processing circuitry 11 assigns seed values of a plurality of pseudo random numbers to the plurality of untrained DNNs. Then, the processing circuitry 11 generates a sequence of random numbers based on the seed values for each of the untrained DNNs. Each of the random numbers included in the sequence corresponds to the number of the node to be erased. Thus, the erasure order of each node is determined by the sequence of random numbers. The processing circuitry 11 determines the parameter value of the learned DNN (first temporary reconstruction DNN) by dropping out and learning according to the determined erasure order. Since the values of the parameters of the first provisional reconstruction DNNs are determined in accordance with the different erasure orders, the values of the parameters can be varied over all first provisional reconstruction DNNs.

A plurality of first provisional reconstruction DNNs may share some of the parameters. For example, learning in which some of the parameters are shared is performed in the following procedures. First, 100-epoch learning is performed for the first provisional reconstruction DNN #1, thereby obtaining a parameter set EP1 of the first provisional reconstruction DNN #1. Of the parameter set EP1, about 80% of the parameters are fixed with the remaining 20% being variable, and 100-epoch learning is additionally performed, thereby obtaining a parameter set EP2 of the first provisional reconstruction DNN #2. The procedure described above sharing some of the parameters is repeated, so that an N-number of first provisional reconstruction DNNs can be generated.

In the above two examples for varying the elements, the input order of the training samples and the node erasure order in the dropout are determined by random numbers; however, the embodiment is not limited to these examples. For example, the input order of the training samples or the node erasure order in the dropout may be determined manually by a user or the like. Alternatively, they may be determined by a function or a rule to determine the input order of the training samples or the node erasure order in the dropout by random numbers.

Figure 4:
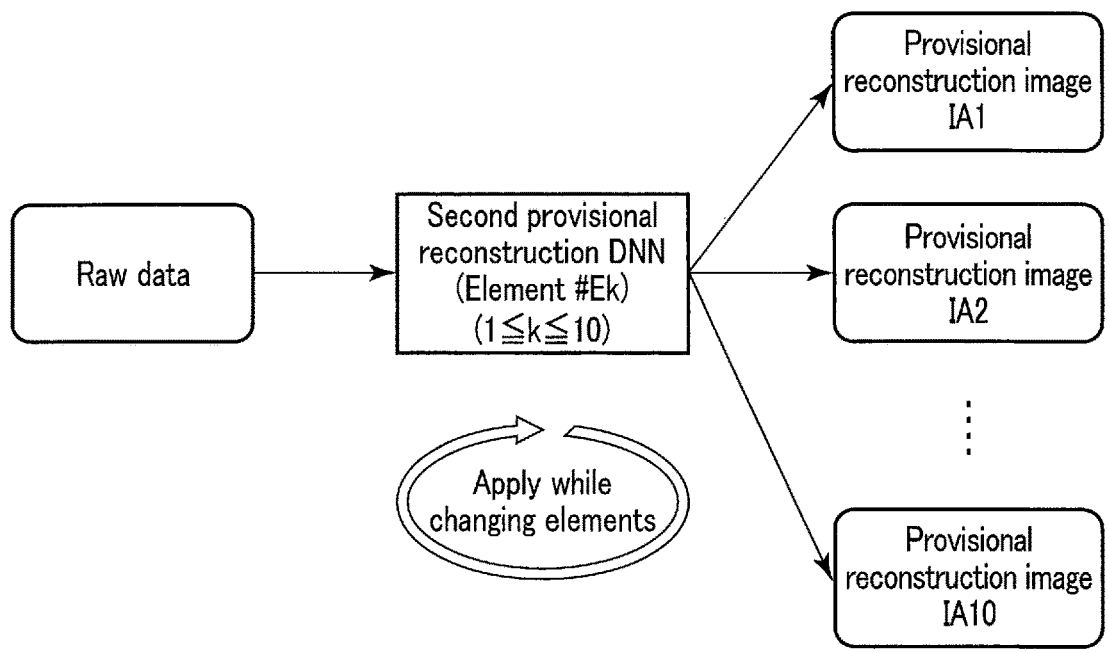
FIG. 4 is a schematic diagram showing a second generation method used in step SA2 illustrated in FIG. 2.

FIG. 4 is a diagram schematically showing the second generation method. As shown in FIG. 4, in the second generation method, the processing circuitry 11 applies a single second provisional reconstruction DNN to a set of raw data an N-number of times, while changing an element #Ek, thereby generating an N-number of provisional reconstruction images. Here, k is an index indicative of the number of repeated rounds in the N-number of times of an iterative process that is applied to the provisional reconstruction DNN. N may be any number that is at least two. For example, in the example shown in FIG. 4, N is 10. The element #Ek is set to different values over a plurality of repeated rounds. The element #Ek may be a parameter or a network architecture.

The second provisional reconstruction DNN is a DNN trained to output a provisional reconstruction image from a set of raw data of the target of treatment as an input. The second provisional reconstruction DNN is generated as a template. Some of the elements of the second provisional reconstruction DNN are set as an element that is changed in the N-number of times of an iterative process. In the following, to specifically provide explanations, it is assumed that the element to be changed is a part of the network architecture of the second provisional reconstruction DNN.

In the first round, the processing circuitry 11 determines a network architecture #E1 relating to the first round, applies the raw data to the second provisional reconstruction DNN having the determined network architecture #E1, and outputs a provisional reconstruction image IA1. As described above, the network architecture of this embodiment is a system of connection between a node of one layer and a node of another layer. In the second round, the processing circuitry 11 changes the network architecture #E1 to a second network architecture #E2, applies the raw data to the second provisional reconstruction DNN having the network architecture #E2, and outputs a provisional reconstruction image IA2. Specifically, the connection between nodes of a part of the second provisional reconstruction DNN, which is the template, is turned on or off, thereby determining or changing the network architecture. The connection between nodes that is turned on or off may be determined by random numbers, or in accordance with any function or rule, or determined manually by the user or the like. If one node is connected to 32 nodes, it is not necessary for all connections to the 32 nodes to be changeable; that is, the nodes to be connected may be limited to a predetermined range.

Thus, the change of the network architecture #Ek and the output of the provisional reconstruction image IAk are repeated an N number of times. For example, in the case of N=10, the network architecture #Ek is changed 10 times. By inputting common raw data to the second provisional reconstruction DNN having the network architectures #E1 to #E10, 10 second provisional reconstruction images IA1 to IA10 are generated. The 10 second provisional reconstruction images IA1 to IA10 are based on the common raw data; however, since the used network architectures of the second provisional reconstruction DNN are different, a pixel value of one pixel of one image may be different from that of another, with the result that qualities of the images may be different. In particular, with regard to pixels in which reconstruction by the DNN is unstable, pixel values are liable to vary largely over all provisional reconstruction images IA1 to IA10.

A method for generating the second provisional reconstruction DNN will now be described. The second provisional reconstruction DNN may be generated by the medical data processing apparatus 1 or may be generated by any other computer. Hereinafter, a computer including a processor such as a CPU, a GPU, etc., for generating the second provisional reconstruction DNN will be referred to as a model learning apparatus.

The method for generating the second provisional reconstruction DNN is the same as the method for generating each first provisional reconstruction DNN. The model learning apparatus generates the second provisional reconstruction DNN by causing a DNN to perform machine learning based on a plurality of training samples. The training samples are also the same as those used for the first provisional reconstruction DNNs. The model learning apparatus generates the second provisional reconstruction DNN by repeating the forward propagation processing, the back propagation processing, and the parameter update processing, while changing the training samples.

In the first generation method, a plurality of first provisional reconstruction DNNs are used. Therefore, the number of used parameters of the DNNs is greater than that in the second generation method using a single second provisional reconstruction DNN, but an ensemble learning effect can be obtained. Contrarily, in the second generation method, a single second provisional reconstruction DNN is used. Therefore, the number of used parameters in the DNN is smaller and the calculation cost is lower as compared to the first generation method using a plurality of first provisional reconstruction DNNs.

After step SA2 is performed the processing circuitry 11 outputs a DNN reconstruction image and a reconstruction reliability based on the provisional reconstruction images generated in step SA2 (step SA3). The DNN reconstruction image is a medical image based on the provisional reconstruction images. The reconstruction reliability is data indicative of the reliability of the DNN reconstruction image based on the provisional reconstruction images. As methods for outputting the DNN reconstruction image and the reconstruction reliability, a first output method by an arithmetic operation and a second output method utilizing a machine learning model are known.

Figure 5:
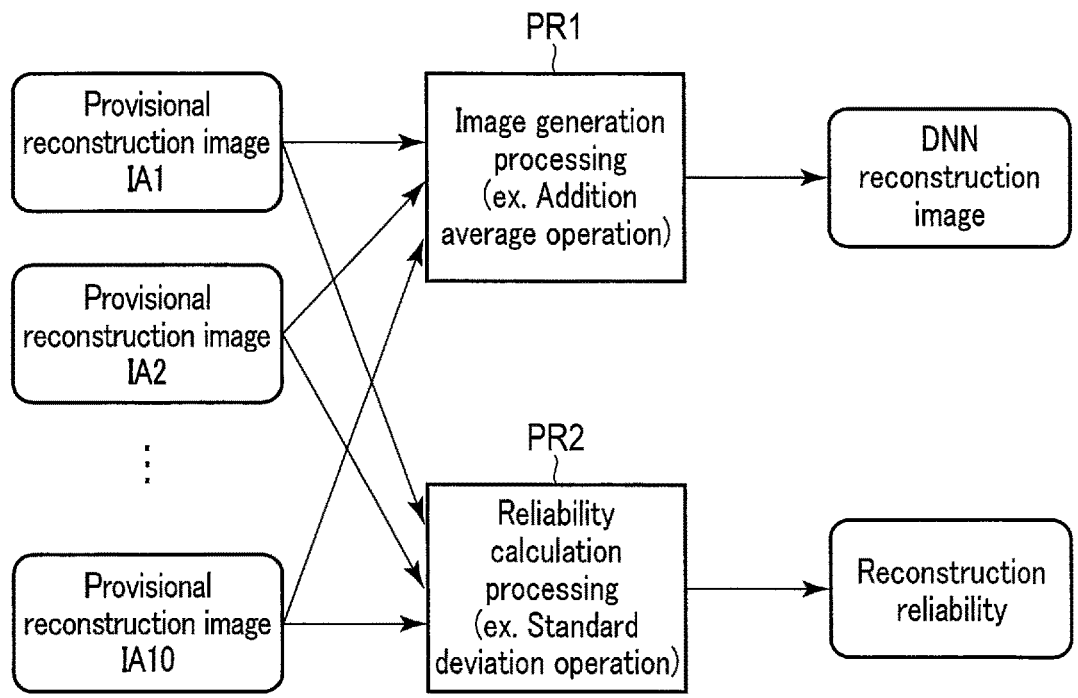
FIG. 5 is a schematic diagram showing a first output method for outputting a DNN reconstruction image and a reconstruction reliability used in step SA3 illustrated in FIG. 2.

FIG. 5 is a diagram schematically showing the first output method. As shown in FIG. 5, the processing circuitry 11 performs image generation processing PR1 on the N-number of provisional reconstruction images IAk ($1 \leq k \leq N$) generated in step SA2, and generates a DNN reconstruction image. N may be any number that is at least two. For example, in the example shown in FIG. 5, N is 10. Furthermore, N may be the same as or less than the number of provisional reconstruction images output by the provisional reconstruction DNNs. The image generation processing PR1 is not particularly limited, but is performed by, for example, an addition average operation, an addition operation, etc. Specifically, the processing circuitry 11 calculates an addition average value or an addition value of pixel values over the provisional reconstruction images IAk in the same pixel. The processing circuitry 11 sets the calculated addition average value or addition value as a pixel value of the same pixel in the reconstruction image. The above processing is repeated while changing the position of the pixel, thereby generating the reconstruction image.

As shown in FIG. 5, the processing circuitry 11 performs reliability calculation processing PR2 on the provisional reconstruction images IAk generated in step SA2, thereby generating a reconstruction reliability. The reconstruction reliability is data indicative of the reliability of the DNN reconstruction image based on the provisional reconstruction images IAk generated in step SA2. The processing circuitry 11 calculates a reconstruction reliability for each of the same image areas in the provisional reconstruction images IAk. The reconstruction reliability evaluates a change in pixel values in the same image area over the provisional reconstruction images IAk. The reconstruction reliability may be, but is not limited to, a standard variation, a sample variance, etc. The reconstruction reliability may be any numerical index that represents a degree of the change in pixel values in the same image area over the provisional reconstruction images IAk. For example, the reconstruction reliability may be a value obtained by performing addition, subtraction, multiplication and division with a predetermined value on the standard variation or the sample variance, or may be a value of the difference between a pixel value of each pixel and a statistical value, such as an average value of pixel values. The image area, namely a unit from which the reconstruction reliability is calculated, may be one pixel, or a pixel group consisting of a plurality of local pixels.

FIG. 6 is a diagram for explaining an idea of the reconstruction reliability. In FIG. 6, an upper part schematically shows a series of provisional reconstruction images IAk, and a lower part is a graph indicative of pixel values of attention pixels P1 and P2 set in the series of provisional reconstruction images IAk. In the graph, the ordinate defines the pixel value, and the abscissa defines the numbers of provisional reconstruction images IAk. In the graph, the pixel values of the pixel P1 and the pixel P2 are plotted. As shown in the graph, the variation of the pixel values of the pixel P1 is relatively small over the series of provisional reconstruction images IAk, whereas the variation of the pixel values of the pixel P2 is relatively large over the series of provisional reconstruction images IAk.

As described above, the DNN reconstruction image is based on the series of provisional reconstruction images IAk, and is obtained as, for example, an addition average image or an addition image of the series of provisional reconstruction images IAk. The series of provisional reconstruction images IAk are obtained by applying provisional reconstruction DNNs having different elements to the same raw data. Thus, in the DNN reconstruction according to the present embodiment, the DNN reconstruction image is obtained from the raw data by way of the series of provisional reconstruction images IAk. In the DNN reconstruction image generated through the process described above, the variation of the pixel values of the series of provisional reconstruction images IAk is relatively small for the pixel P1 in which the DNN reconstruction is relatively stable. Accordingly, the reliability of the pixel P1 is considered to be high. The variation of the pixel values of the series of provisional reconstruction images IAk is relatively large for the pixel P2 in which the DNN reconstruction is relatively unstable. Accordingly, the reliability of the pixel P2 is considered to be low. Since the reconstruction reliability, as described above, represents the variation of the pixel values of the same image area of the series of provisional reconstruction images IAk, the reliability of the DNN reconstruction image can be accurately evaluated.

FIG. 7 is a schematic diagram showing the second output method for outputting a DNN reconstruction image and a reconstruction reliability. As shown in FIG. 7, the processing circuitry 11 outputs a DNN reconstruction image and a reconstruction reliability from the series of N-number of provisional reconstruction images IAk ($1 \leq k \leq N$) utilizing the reconstruction DNN in the second output method. N may be any number that is at least two. For example, in the example shown in FIG. 7, N is 10. Furthermore, N may be the same as or less than the number of provisional reconstruction images output by the provisional reconstruction DNNs. The reconstruction DNN is a DNN trained on the basis of input data including an N-number of provisional reconstruction images IA1 to IA10, and output data including a DNN reconstruction image based on the N-number of provisional reconstruction images IA1 to IA10 and the reconstruction reliability of the DNN reconstruction image.

A method for generating the reconstruction DNN will now be described. The reconstruction DNN may be generated by the medical data processing apparatus 1 or by any other computer. Hereinafter, a computer including a processor such as a CPU, a GPU, etc., for generating the reconstruction DNN will be referred to as a model learning apparatus.

The method for generating the reconstruction DNN is the same as the method for generating each first provisional reconstruction DNN. The model learning apparatus generates the reconstruction DNN by causing the DNN to perform machine learning based on a plurality of training samples. The training sample is a combination of a plurality of provisional reconstruction images which is input data, and a correct DNN reconstruction image and a correct reconstruction reliability which are correct data. The model learning apparatus performs forward propagation processing by applying the DNN to a plurality of provisional reconstruction images, and outputs a DNN reconstruction image (hereinafter referred to as an estimated DNN reconstruction image) and a reconstruction reliability (hereinafter referred to as an estimated reconstruction reliability). Next, the model learning apparatus performs back propagation processing by applying to the DNN a difference (loss) between the estimated DNN reconstruction image and the estimated reconstruction reliability on one hand, and the correct DNN reconstruction image and the correct reconstruction reliability on the other hand, and calculates a gradient vector. Subsequently, the model learning apparatus updates parameters (parameters) of the DNN, such as a weight and a bias, etc., based on the gradient vector. The reconstruction DNN is generated by repeating the forward propagation processing, the back propagation processing, and the parameter update processing, while changing the training samples.

Next, a method of generating a training sample will be described. In magnetic resonance imaging, data acquisition is performed the number of times corresponding to the number of excitations (NEX) for the same body part (hereinafter referred to as NEX acquisition), thereby generating MR images corresponding to the NEX (hereinafter referred to as NEX images). The NEX images corresponding to the NEX are added or addition-averaged, so that a single addition image or addition-averaged image is obtained. In the following, the addition image and the addition-averaged image are not particularly distinguished, and each is simply referred to as the addition image. For example, in the case of NEX=10, NEX acquisition is performed 10 times for the same body part, generating 10 NEX images, and an addition image based on the 10 NEX images is obtained. Typically, although the imaging parameter is set to the same over a plurality of times of data acquisition, image qualities of the generated NEX images are not completely the same. The addition image is an image in which variations of the image qualities of the MR images of the respective excitations are averaged. Therefore, an NEX image may be used as input data of the training sample, and an addition image as a correct DNN reconstruction image. As a correct reconstruction reliability, the reconstruction reliability, such as the standard variation or the sample variance for the same image area, calculated on the basis of a plurality of provisional reconstruction images, may be used.

In the NEX acquisition, parallel imaging of a sensitivity encoding (SENSE) method or the like may be performed. The portion of a signal-to-noise ratio that depends on a coil geometry in the SENSE method is called a g factor. Since the g factor is determined in accordance with the positional relationship between each pixel and a coil, it has different values depending on the pixel positions. Thus, the g factor can be understood as a reliability for the pixel value of each pixel; therefore, it may be used as a correct reconstruction reliability. By performing machine learning using the g factor as a correct reconstruction reliability, a reconstruction reliability similar to the g factor may be output by using the reconstruction DNN. In this case, the reconstruction reliability can be compared with the g factor, etc., by aligning the scale of the reconstruction reliability with the scale of the g factor.

In step SA3, it is assumed that the processing circuitry 11 obtains the DNN reconstruction image and the reconstruction reliability using the reconstruction DNN trained to output both the DNN reconstruction image and the reconstruction reliability. However, the present embodiment is not limited thereto. For example, the processing circuitry 11 may be configured to output the DNN reconstruction image using the DNN trained to output only the DNN reconstruction image from a plurality of provisional reconstruction images as an input. In this case, the processing circuitry 11 may perform reliability calculation processing PR2 on the provisional reconstruction images, thereby generating a reconstruction reliability. Alternatively, the processing circuitry 11 may be configured to output the reconstruction reliability using the DNN trained to output only the reconstruction reliability from a plurality of provisional reconstruction images as an input. In this case, the processing circuitry 11 may perform image generation processing PR1 on the provisional reconstruction images, thereby generating a DNN reconstruction image.

According to the first output method, unlike the second output method, the reconstruction reliability is obtained by the arithmetic operation. Therefore, reconstruction reliability at a high sensitivity for the provisional reconstruction images as the target of treatment can be obtained. According to the second output method, unlike the first output method, the reconstruction reliability is obtained by using the DNN. Therefore, a bias of the reconstruction reliability can be corrected.

After step SA3 is performed, the processing circuitry 11 causes the DNN reconstruction image and the reconstruction reliability, which have been output in step SA3, to be displayed (step SA4). The processing circuitry 11 may display the reconstruction reliability in a tabular format, in which a pixel and a numerical value of the reconstruction reliability are associated, or in a format of a spatial distribution of reconstruction reliabilities (hereinafter referred to as the reconstruction reliability map).

FIG. 8 is a diagram showing an example of a display screen I1 including a DNN reconstruction image I11 and a reconstruction reliability map I12. As shown in FIG. 8, the processing circuitry 11 displays the DNN reconstruction image I11 and the reconstruction reliability map I12, for example, in parallel. The reconstruction reliability map I12 is a spatial distribution of the reconstruction reliabilities, in which a gray value, a color value or the like, corresponding to the reliability, is assigned to each pixel. By the display of the reconstruction reliability map I12, the user can evaluate the reliability of the DNN reconstruction image I11. Furthermore, by the display of both the reconstruction image I11 and the reconstruction reliability I12, the user can ascertain which portion of the DNN reconstruction image I11 has a high or low reconstruction reliability.

The display formats of the DNN reconstruction image I11 and the reconstruction reliability I12 are not limited to those described above. For example, the processing circuitry 11 may cause the reconstruction reliability map I12 to be superimposed on the DNN reconstruction image I11. In this case, the processing circuitry 11 may extract a region in which the reconstruction reliability is higher or lower than an arbitrary threshold value, and may cause the reconstruction reliability map I12 to be superimposed on the DNN reconstruction image I11 only in the extracted region.

Furthermore, the processing circuitry 11 may specify a region of the DNN reconstruction image I11 in which the reconstruction reliability is lower than the threshold value, and emphasize the specified region as an unreliable region with a visual effect, such as a color, a flag, etc. Contrarily, the processing circuitry 11 may specify a region of the DNN reconstruction image I11 in which the reconstruction reliability is higher than the threshold value, and emphasize the specified region as a reliable region with a visual effect, such as a color, a flag, etc.

Further, if a pixel on the DNN reconstruction image I11 or the reconstruction reliability map I12 is designated by the input interface 14 or the like, the processing circuitry 11 may display a basis of the reconstruction reliability of the designated pixel. For example, as the basis, the processing circuitry 11 may display a numerical value of the reconstruction reliability, or a graph showing the variation of the pixel value of the designated pixel over the series of provisional reconstruction images as shown in the lower part of FIG. 6.

In the manner described above, the DNN reconstruction processing by the processing circuitry 11 according to the first embodiment ends.

The flow of the DNN reconstruction processing shown in FIG. 2 is only an example, and is not limited to this example. For example, in step SA2, the processing circuitry 11 generates the provisional reconstruction images using the provisional reconstruction DNN. However, the first embodiment is not limited thereto. For example, the processing circuitry 11 may use NEX images obtained by the NEX acquisition as provisional reconstruction images. Specifically, the processing circuitry 11 performs a conventional reconstruction operation, such as an inverse Fourier transformation or an iterative reconstruction, on k-space data acquired by each of the excitations, thereby reconstructing NEX images. In step SA3, the processing circuitry 11 applies to the reconstruction DNN a plurality of NEX images respectively corresponding to a plurality of excitations, and outputs the DNN reconstruction image based on the NEX images and the reconstruction reliability. According to this method, the bias of the addition operation can be corrected better than in the case of performing the addition operation on a plurality of NEX images to generate an addition image.

The provisional reconstruction image input to the reconstruction DNN is not limited to a medical image generated by one medical apparatus, but may be a composite image of two or more medical images generated by two or more medical apparatuses. For example, the image input to the reconstruction DNN may be a composite image of a PET image generated by a PET apparatus and a CT image generated by an X-ray computed tomography apparatus, or may be a composite image of a PET image generated by a PET apparatus and an MR image generated by a magnetic resonance imaging apparatus. Furthermore, the image input to the reconstruction DNN may be a composite image of an optical image generated by an optical camera apparatus and an MR image generated by a magnetic resonance imaging apparatus or a CT image generated by an X-ray computed tomography apparatus. For example, by using a composite image of an endoscope image and an MR image, it is possible to compare and observe a wound inside the body and a wound on the body surface. Furthermore, the image input to the reconstruction DNN may be a composite image of an image for a left eye and an image for a right eye generated by X-ray stereo imaging.

As described above, the medical data processing apparatus 1-1 according to the first embodiment includes at least the processing circuitry 11. The processing circuitry 11 generates a plurality of provisional reconstruction images by applying a plurality of first provisional reconstruction DNNs having different elements to a set of raw data, or applying a second provisional reconstruction DNN to a set of raw data a plurality of times while changing elements. The processing circuitry 11 outputs the DNN reconstruction image and the reconstruction reliability based on the provisional reconstruction images.

According to the architecture described above, the DNN reconstruction image is generated from the raw data by way of the provisional reconstruction images. In the DNN reconstruction image generated through the process described above, the reliability of the DNN reconstruction image can be evaluated by defining the reliability based on the provisional reconstruction images.

Second Embodiment

The medical data processing apparatus according to the second embodiment utilizes the reconstruction reliability output from the apparatus of the first embodiment. Hereinafter, the medical data processing apparatus according to the second embodiment will be described. In the description below, structural elements with substantially the same functions as those of the first embodiment will be denoted by the same reference symbols, and a repetitive description will be given only where necessary.

Figure 9:
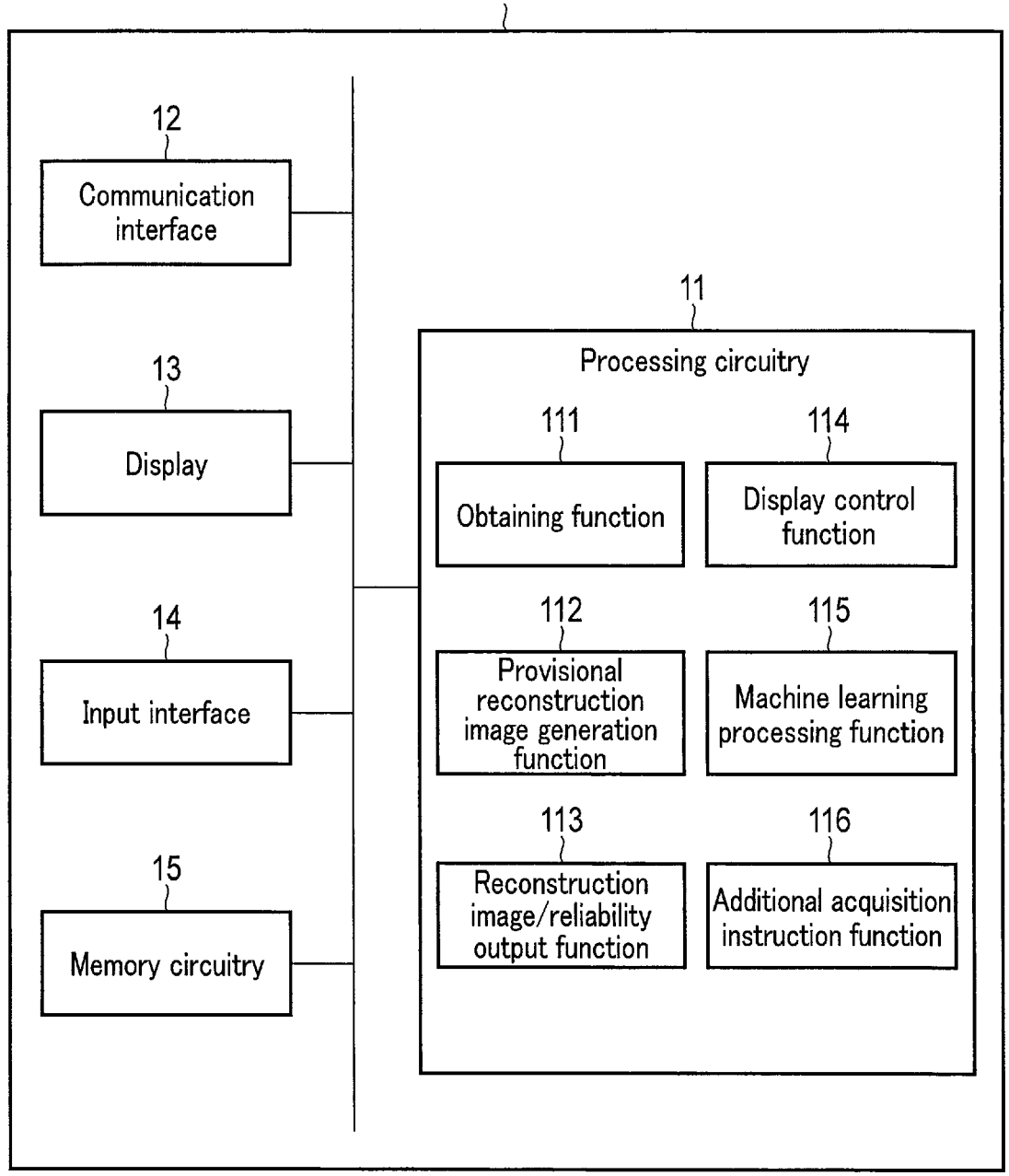
FIG. 9 is a diagram showing a configuration of a medical data processing apparatus according to a second embodiment.

FIG. 9 is a diagram showing an architecture of a medical data processing apparatus 1-2 according to the second embodiment. As shown in FIG. 9, the medical data processing apparatus 1-2 includes processing circuitry 11, a communication interface 12, a display 13, an input interface 14, and a memory circuitry 15. The processing circuitry 11 implements a machine learning processing function 115 and an additional acquisition instruction function 116, in addition to the obtaining function 111, the provisional reconstruction image generation function 112, the reconstruction image/reliability output function 113, and the display control function 114.

By implementing the machine learning processing function 115, the processing circuitry 11 applies to the DNN reconstruction image and the reconstruction reliability a third machine learning model that performs image recognition, and outputs a processing result of the image recognition for the DNN reconstruction image and a second reliability relating to the processing result. In the following, the third machine learning model is referred to as the image recognition DNN, and the second reliability as the image recognition reliability.

By implementing the additional acquisition instruction function 116, the processing circuitry 11 instructs a control unit of a magnetic resonance imaging apparatus to additionally acquire raw data, if the image recognition reliability is lower than a threshold value. The control unit of the magnetic resonance imaging apparatus is, for example, an imaging controller configured to control MR imaging by an MR imaging mechanism. The imaging controller includes, as hardware resources, a processor such as a CPU, and a memory such as a ROM or a RAM. The imaging controller synchronously controls a gradient field power supply, transmitting circuitry, and receiving circuitry, executes MR imaging on the subject in accordance with a pulse sequence, and acquire k-space data regarding the subject. The acquired k-space data is supplied to the medical data processing apparatus 1-2, and is stored in the memory circuitry 15 as raw data.

The medical data processing apparatus 1-2 according to the second embodiment will be described in detail below.

The image recognition performed by the machine learning processing function 115 may be any type of image recognition, but includes, for example, organ classification or disease determination. An image recognition DNN for organ classification is referred to as an organ classification DNN, and an image recognition DNN for disease determination as a disease determination DNN.

Figure 10:
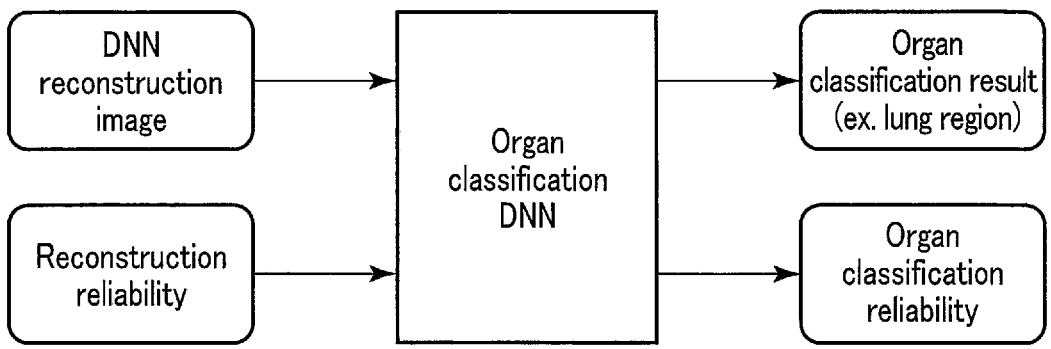
FIG. 10 is a diagram schematically showing an input/output of an organ classification DNN.

FIG. 10 is a diagram schematically showing an input/output of the organ classification DNN. As shown in FIG. 10, the organ classification DNN is a DNN trained to output an organ classification result and an image recognition reliability of the organ classification result (hereinafter referred to as the organ classification reliability) based on the DNN reconstruction image and the reconstruction reliability. The DNN reconstruction image and the reconstruction reliability are output through the reconstruction image/reliability output function 113 as described above. The organ classification result may be output as various formats in accordance with the type of the organ classification DNN. For example, if the organ classification. DNN is configured to output a classification name of each anatomical structure included in the DNN reconstruction image, the organ classification result is the classification name of the anatomical structure. If the organ classification DNN is configured to output a presence or absence of a specific anatomical structure included in the DNN reconstruction image, the organ classification result is the presence or absence of the specific anatomical structure. If the organ classification DNN is configured to output an existence region of each anatomical structure included in the DNN reconstruction image, the organ classification result is a DNN reconstruction image in which the existence region of each anatomical structure is emphasized.

The organ classification reliability is represented by a numerical value of a continuous value or a discrete value, and a sign corresponding to the numerical value. For example, "0" represents a low reliability, "1" represents a high reliability, and "0.5" represents a medium reliability. The organ classification reliability can be output in accordance with the kind of the organ classification result. If the organ classification result is the classification name of each anatomical structure, the organ classification reliability is output as a reliability of the organ corresponding to the classification name. For example, a reliability level, such as "0", "1", "0.5", or the like is output for each classification name, such as "a lung region", "a liver region", or "a heart region". If the organ classification result is a presence or absence of the specific anatomical structure, the organ classification reliability is output as a reliability of the organ corresponding to the anatomical structure. For example, a reliability of "0", "1", "0.5", or the like is output for the organ being "the lung region". If the organ classification result is a DNN reconstruction image in which the existence region of each anatomical structure is emphasized, the reliability of each pixel or image area corresponding to the anatomical structure is output. For example, a reliability of "0", "1", "0.5", or the like is assigned to each pixel for the pixel corresponding to "the lung region".

A method for generating the organ classification DNN will now be described. The organ classification DNN may be generated by the medical data processing apparatus 1-2 or may be generated by any other computer. Hereinafter, a computer including a processor such as a CPU, a GPU, etc., for generating the organ classification DNN will be referred to as a model learning apparatus.

The model learning apparatus generates the organ classification DNN by causing a DNN to perform machine learning based on a plurality of training samples. The training sample is a combination of the DNN reconstruction image and the reconstruction reliability, which are input data, and a combination of the organ classification result (hereinafter referred to as the correct organ classification result) and the organ classification reliability (hereinafter referred to as the correct organ classification reliability), which are correct data. The model learning apparatus performs forward propagation processing by applying the DNN to the combination of the DNN reconstruction image and the reconstruction reliability, and outputs a combination of an organ classification result (hereinafter referred to as an estimated organ classification result) and an organ classification reliability (hereinafter referred to as an estimated organ classification reliability). Subsequently, the model learning apparatus performs back propagation by applying to the DNN a difference (loss) between the combination of the estimated organ classification result and the estimated organ classification reliability and the combination of the correct organ classification result and the correct organ classification reliability, and calculates a gradient vector. Subsequently, the model learning apparatus updates parameters of the DNN, such as a weight and a bias, etc., based on the gradient vector. The organ classification DNN is generated by repeating the forward propagation processing, the back propagation processing, and the parameter update processing, while changing the training samples.

The correct organ classification result and the correct organ classification reliability may be, for example, manually generated by the user. For example, through visual observations the user specifies an image area corresponding to the organ as a target of classification from medical images, and adds an annotation to the specified image area. The image area with the annotation is used as a correct organ classification result. Furthermore, the user subjectively evaluates the organ classification made by himself/herself, and determines the organ classification reliability. For example, if the user has no confidence in the organ classification, the user will determine the organ classification reliability to be "0". If the user has full confidence in the organ classification, the user will determine the organ classification reliability to be "1". The determined organ classification reliability is allocated to the image area as a correct organ classification reliability. The correct organ classification result or the correct organ classification reliability may be automatically determined by image recognition processing, or the correct organ classification result and the correct organ classification reliability may be automatically determined by image recognition processing.

Figure 11:
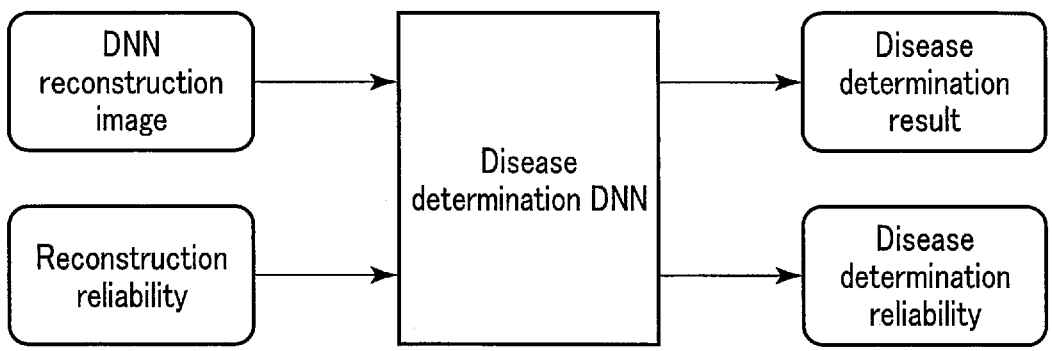
FIG. 11 is a diagram schematically showing an input/output of a disease determination DNN.

FIG. 11 is a diagram schematically showing an input/output of a disease determination DNN. As shown in FIG. 11, the disease determination DNN is a DNN trained to output a disease determination result and an image recognition reliability of the disease determination result (hereinafter referred to as the disease determination reliability) based on the DNN reconstruction image and the reconstruction reliability. The DNN reconstruction image and the reconstruction reliability are output through the reconstruction image/reliability output function 113 as described above. The disease determination result may be output as various formats in accordance with the type of the disease determination DNN. For example, if the disease determination DNN is configured to output a classification name of a pathological abnormality included in the DNN reconstruction image, the disease determination result is the classification name of the pathological abnormality. If the disease determination DNN is configured to output a presence or absence of a specific disease included in the DNN reconstruction image, the disease determination result is a presence or absence of the specific pathological abnormality. If the disease determination DNN is configured to output an existence region of a disease included in the DNN reconstruction image, the disease determination result is a DNN reconstruction image in which the existence region of the pathological abnormality is emphasized.

The disease determination reliability is represented by a numerical value of a continuous value or a discrete value, and a sign corresponding to the numerical value. For example, "0" represents a low reliability, "1" represents a high reliability, and "0.5" represents a medium reliability. The disease determination reliability can be output in accordance with the kind of the disease determination result, in the same manner as the organ classification result is output.

A method for generating the disease determination DNN will now be described. The disease determination DNN may be generated by the medical data processing apparatus 1-2 or may be generated by any other computer. Hereinafter, a computer including a processor such as a CPU, a GPU, etc., for generating the disease determination DNN will be referred to as a model learning apparatus.

The model learning apparatus generates the disease determination DNN by causing the DNN to perform machine learning based on a plurality of training samples. The training sample is a combination of the DNN reconstruction image and the reconstruction reliability, which are input data, and a combination of the disease determination result (hereinafter referred to as the correct disease determination result) and the disease determination reliability (hereinafter referred to as the correct disease determination reliability), which are correct data. The model learning apparatus performs forward propagation processing by applying a DNN to the combination of the DNN reconstruction image and the reconstruction reliability, and outputs a combination of a disease determination result (hereinafter referred to as an estimated disease determination result) and a disease determination reliability (hereinafter referred to as an estimated disease determination reliability). Subsequently, the model learning apparatus performs back propagation by applying to the DNN a difference (loss) between the combination of the estimated disease determination result and the estimated disease determination reliability and the combination of the correct disease determination result and the correct disease determination reliability, and calculates a gradient vector. Subsequently, the model learning apparatus updates parameters of the DNN, such as a weight, a bias, etc., based on the gradient vector. The disease determination DNN is generated by repeating the forward propagation processing, the back propagation processing, and the parameter update processing, while changing the training samples.

The correct disease determination result and the correct disease determination reliability may be, for example, manually generated by the user. For example, the user observes a medical image and determines the classification name of the disease. The determined classification name of the disease is used as a correct disease determination result. Furthermore, the user subjectively evaluates its own disease determination, and determines the disease determination reliability.

For example, if the user has little confidence in the disease determination, the user will determine the disease determination reliability to be "0.3". If the user has much confidence in the disease determination, the user will determine the disease determination reliability to be "0.9". The determined disease determination reliability is associated with the classification name as the correct disease determination reliability. The correct disease determination result or the correct disease determination reliability may be automatically determined by image recognition processing, or the correct disease determination result and the correct disease determination reliability may be automatically determined by image recognition processing.

FIG. 12 is a diagram showing a typical flow of reconstruction reliability utilizing processing performed by processing circuitry 11 according to the second embodiment.

As shown in FIG. 12, the processing circuitry 11 obtains the DNN reconstruction image and the reconstruction reliability output through step SA3, etc. (step SB1).

After step SB1 is performed, the processing circuitry 11 outputs an image recognition result and an image recognition reliability from the DNN reconstruction image and the reconstruction reliability utilizing the image recognition DNN (step SB2). For example, if the processing circuitry 11 receives an instruction to perform organ classification as image recognition, it applies the organ classification DNN to the DNN reconstruction image and the reconstruction reliability, thereby outputting the organ classification result and the organ classification reliability. If the processing circuitry 11 receives an instruction to perform disease determination as image recognition, it applies the disease determination DNN to the DNN reconstruction image and the reconstruction reliability, thereby outputting the disease determination result and the disease determination reliability.

After step SB2 is performed, the processing circuitry 11 causes the image recognition result and the image recognition reliability output in step SB2 to be displayed (step SB3). For example, the processing circuitry 11 displays the display screen of the image recognition result and the image recognition reliability on the display device 13.

An example of a display in the case where the image recognition is a disease determination will be described.

Figure 13:
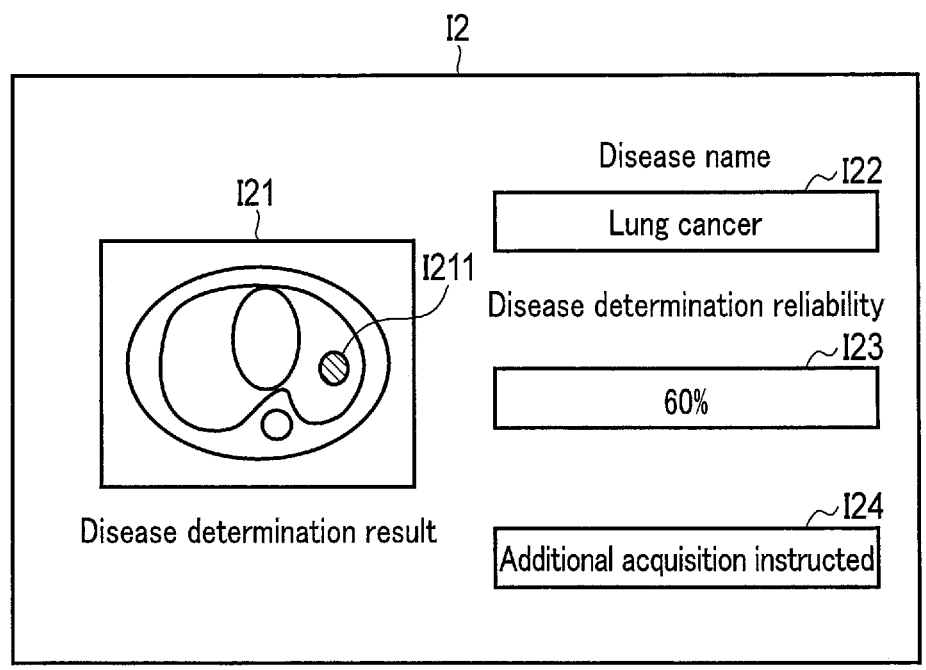
FIG. 13 is a diagram showing an example of a display screen including a disease determination result and a disease determination reliability.

FIG. 13 is a diagram showing an example of a display screen 12 including a disease determination result and a disease determination reliability. As shown in FIG. 13, a segmentation image 121 and a disease name 122 are displayed as the disease determination result. For example, if the disease is determined to be lung cancer by the disease determination DNN based on the DNN reconstruction image, the segmentation image 121 displays a lung cancer area 1211 with emphasis, and displays "lung cancer" as the disease name 122. "60%" for example is displayed as the disease determination reliability 123. Since the disease determination reliability is displayed in addition to the disease determination result, the user can estimate the trustworthiness of the disease determination result, and can make a more accurate diagnosis.

After step SB3 is performed, the processing circuitry 11 determines whether the image recognition reliability is smaller than a threshold value (step SB4). The threshold value is not particularly limited, and may be a lower limit that allows the user to accept the image recognition result.

If the image recognition reliability is determined to be smaller than the threshold value (step SB4: YES), the processing circuitry 11 instructs an additional acquisition for the imaging controller of a magnetic resonance imaging apparatus (step SB5). The additional acquisition is performed for the purpose of re-sampling raw data, etc., due to a low image recognition reliability. The imaging controller controls the MR imaging mechanism upon receipt of the instruction for additional acquisition, so that MI imaging is performed on the subject, thereby additionally acquiring raw data. The additionally acquired raw data is converted to a DNN reconstruction image through the reconstruction image/reliability output function 113, for example in the same manner as in the first embodiment, and subjected to image recognition or the like through the machine learning processing function 115. The additionally acquired raw data may be converted to a reconstruction image through, not the DNN reconstruction processing, but an analytical or statistical reconstruction method, such as an inverse Fourier transformation or an iterative reconstruction.

The determination result in step SB4 may be displayed in a display column 124 or the like in the display screen 12 shown in FIG. 13. For example, if the image recognition reliability is determined to be smaller than the threshold value, the display column 124 may display a message, such as "additional acquisition instructed", which means additional acquisition is instructed. Furthermore, if the image recognition reliability is determined to be greater than the threshold value, the display column 124 may display a message, such as "additional acquisition not instructed because the disease determination reliability is high", which means no additional acquisition is instructed.

In the manner described above, the reconstruction reliability utilizing processing performed by the processing circuitry 11 according to the second embodiment ends.

The reconstruction reliability utilizing processing shown in FIG. 12 is not limited to the above but may be changed as appropriate. For example, in step SB5, the additional acquisition is automatically instructed, if the image recognition reliability is smaller than the threshold value. However, the processing circuitry 11 may instruct the imaging controller of the magnetic resonance imaging apparatus to perform additional acquisition upon receipt of a definite instruction by the user through the input interface 14.

As explained above, the medical image processing apparatus 1-2 according to the second embodiment includes at least the processing circuitry 11. The processing circuitry 11 obtains a DNN reconstruction image and a reconstruction reliability. The processing circuitry 11 applies the image recognition DNN to the DNN reconstruction image and the reconstruction reliability, thereby outputting the image recognition result and the image recognition reliability.

According to the architecture described above, it is possible to output the image recognition result and the image recognition reliability in view of not only the DNN reconstruction image but also the reconstruction reliability. This results in an improvement in the reliability of the image recognition result.

(Modification)

In the first embodiment, the inputs to the reconstruction DNN are the provisional reconstruction images generated by the plurality of first provisional reconstruction DNNs relating to a plurality of elements, or the provisional reconstruction images generated by the single second provisional reconstruction DNN a plurality of times while changing the elements. In the modification, the input to the reconstruction DNN is a medical image that is generated during iterative reconstruction. Hereinafter, a medical data processing apparatus according to the modification will be described. In the description below, structural elements with substantially the same functions as those of the first embodiment will be denoted by the same reference symbols, and a repetitive description will be given only where necessary.

FIG. 14 is a drawing schematically showing a flow of the DNN reconstruction processing according to the modification. As shown in FIG. 14, in the iterative reconstruction, the processing circuitry 11 performs iterative reconstruction on raw data by implementing the provisional reconstruction image generation function 112, and generates an N-number of intermediate images ITk ($1 \leq k \leq N$) and a final image IF. More specifically, the processing circuitry 11 updates raw data or the intermediate images ITk based on the raw data, until the image quality satisfies a predetermined stopping condition, and outputs as a final image the intermediate image ITk based on the raw data that satisfies the stopping condition, or the intermediate image ITk that satisfies the stopping condition. For example, in the case shown in FIG. 14, nine intermediate images IT1 to IT9 and one final image IF are generated.

A method for iterative reconstruction is not particularly limited. For example, compressed sensing is known as the iterative reconstruction applicable to k-space data acquired by a magnetic resonance imaging apparatus.

The compressed sensing is performed through, for example, the procedure as follows. S1. The processing circuitry 11 performs an inverse Fourier transformation on the k-space data acquired through undersampling (hereinafter referred to as observation k-space data), thereby reconstructing an initial image in real space, and performs a sparse transformation, such as a wavelet transformation, on the initial image, thereby generating a sparse space image. S2. The processing circuitry 11 performs L1 norm minimization on the sparse space image. S3. The processing circuitry 11 performs an inverse sparse transformation, such as an inverse wavelet transformation, on the sparse real space image after the L1 norm minimization, thereby generating an intermediate image in the real space. S4. The processing circuitry 11 performs a Fourier transformation on the intermediate image, and converts it to k-space data (hereinafter referred to as calculation k-space data). S5. The processing circuitry 11 determines whether the image quality of the calculation k-space data satisfies the stopping condition based on a comparison between the observation k-space data and the calculation k-space data. S6. The processing circuitry 11 updates the calculation k-space data if the stopping condition is not satisfied. The processes S1 to S6 are repeated, and if the processing circuitry 11 determines that the stopping condition is satisfied, it sets an intermediate image obtained immediately previously as a final image.

As shown in FIG. 14, by implementing the reconstruction image/reliability output function 113, the processing circuitry 11 applies the nine intermediate images IT1 to IT9 and the final image IF to the reconstruction DNN, and outputs one DNN reconstruction image and reconstruction reliability. Since the DNN reconstruction image is based on the nine intermediate images IT1 to IT9 and the final image IF, the image quality thereof is higher than that of each intermediate image ITk and the final image IF.

A method for generating the reconstruction DNN according to the modification will now be described. The reconstruction DNN may be generated by the medical data processing apparatus 1-1 or may be generated by any other computer. Hereinafter, a computer including a processor such as a CPU, a GPU, etc., for generating the reconstruction DNN will be referred to as a model learning apparatus.

The method for generating the reconstruction DNN according to the modification is the same as the method for generating the reconstruction DNN according to the first embodiment. The model learning apparatus generates the reconstruction DNN by causing a DNN to perform machine learning based on a plurality of training samples. The training sample is a combination of the intermediate images and the final image, which are input data, and a combination of the DNN reconstruction image (hereinafter referred to as the correct reconstruction image) and the reconstruction reliability (hereinafter referred to as the correct reconstruction reliability), which are correct data. The model learning apparatus performs forward propagation processing by applying the DNN to the intermediate images and the final image, and outputs a DNN reconstruction image (hereinafter referred to as an estimated DNN reconstruction image) and a reconstruction reliability (hereinafter referred to as an estimated reconstruction reliability). Next, the model learning apparatus performs back propagation processing by applying to the DNN a difference (loss) between the estimated DNN reconstruction image and the estimated reconstruction reliability on one hand, and the correct DNN reconstruction image and the correct reconstruction reliability on the other hand, and calculates a gradient vector. Subsequently, the model learning apparatus updates parameters of the DNN, such as a weight, a bias, etc., based on the gradient vector. The reconstruction DNN is generated by repeating the forward propagation processing, the back propagation processing, and the parameter update processing, while changing the training samples.

As the correct DNN reconstruction image, for example, a high-quality reconstruction image that is reconstructed by performing any reconstruction method on raw data may be used, the raw data being the input data used to generate the intermediate images and the final image. Alternatively, as the correct DNN reconstruction image, an addition image or an addition average image of the intermediate images and the final image, which are the input data, may be used. Through learning with an appropriate correct DNN reconstruction image, the image quality of the DNN reconstruction image output from the reconstruction DNN can be improved.

According to the above explanation, the inputs to the reconstruction DNN in the modification are the intermediate images and the final image. However, the inputs are not limited thereto; for example, the inputs to the reconstruction DNN in the modification may be only the intermediate images. Furthermore, the intermediate images input to the reconstruction DNN in the modification may be all of the intermediate images generated in the iterative reconstruction, or some of all of the intermediate images. For example, intermediate images obtained before the processing is repeated the predetermined number of times, which are generally estimated at a low image quality, may be discarded, and intermediate images obtained after the processing is repeated the predetermined number of times may be input to the reconstruction DNN.

Furthermore, in the explanation of the modification, the reconstruction DNN of the modification outputs the DNN reconstruction image and the reconstruction reliability. However, the present embodiment is not limited thereto. The reconstruction DNN may be a DNN trained to output a DNN reconstruction image from a medical image generated in the process of the iterative reconstruction as an input. Alternatively, the reconstruction DNN may be a DNN trained to output a reconstruction reliability from a medical image generated in the process of the iterative reconstruction as an input.

The reconstruction DNN of the modification is applicable to not only k-space data acquired by the magnetic resonance imaging apparatus but also projection data acquired by an X-ray computed tomography apparatus. Examples of the iterative reconstruction applicable to the projection data acquired by the X-ray computed tomography apparatus include an expectation maximization (EM) method, an algebraic reconstruction technique (ART) method, and their applications. Examples of the iterative reconstruction method may include the above methods in combination with the analytical image reconstruction method such as a filtered back projection (FBP) method or a convolution back projection (CBP) method, or the above methods incorporating noise reduction based on a statistical model, a scanner model, an anatomical model, and/or machine learning.

The medical data processing apparatus of the modification includes at least the processing circuitry 11. The processing circuitry 11 obtains raw data, performs iterative reconstruction on the raw data to generate a plurality of medical images as an intermediate product and/or a final product, and applies a machine learning model to the generated medical images, thereby generating a DNN reconstruction image.

According to the above configuration, a new reconstruction method, which is a combination of the iterative reconstruction and the reconstruction DNN, can be provided. The DNN reconstruction image generated by the above configuration is based on a plurality of intermediate images and/or a final image generated in the process of iterative reconstruction. Therefore, the image quality thereof is expected to be higher than that of the final image.

According to at least one embodiment described above, the reliability of a medical image generated by utilizing a machine learning model can be improved.

The term "processor" used in the above explanation indicates, for example, a circuit, such as a CPU, a GPU, or an application specific integrated circuit (ASIC), and a programmable logic device (for example, a simple programmable logic device (SPLD), a complex programmable logic device (CPLD), and a field programmable gate array (FPGA)). The processor reads and executes programs stored in the storage circuitry to realize respective functions thereof. The programs may be directly incorporated in circuitry of the processor, instead of storing them in the memory circuitry. In this case, the processor reads the programs incorporated in its circuitry and executes them to realize the respective functions. Furthermore, instead of executing the programs, functions corresponding to the programs may also be realized by a combination of logic circuits. Each processor of the present embodiment is not limited to the case of being configured as a single circuit for each processor. Therefore, one processor may be configured by a combination of a plurality of independent circuits, and realize the functions thereof. In addition, a plurality of structural elements in FIGS. 1 and 9 may be integrated in one processor to realize the function.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A medical data processing apparatus, comprising:
   circuitry configured to
   generate a plurality of first medical images by applying a plurality of first trained machine learning models, each having at least some different elements, to a same set of raw data, or by applying a first machine learning model to the same set of raw data each time of a plurality of times while changing at least some elements of the first machine learning model each time, so that the first machine learning model is different each time; and
   generate and output a second medical image and a first reliability relating to the second medical image, based on the generated plurality of first medical images.

2. The medical data processing apparatus according to claim 1, wherein the first reliability output by the processing circuitry is information corresponding to variations between the first medical images.

3. The medical data processing apparatus according to claim 1, wherein the first reliability output by the processing circuitry includes a reliability of every same image area of the first medical images.

4. The medical data processing apparatus according to claim 1, wherein the first reliability output by the processing circuitry evaluates a change in pixel values in same image areas over the first medical images.

5. The medical data processing apparatus according to claim 1, wherein:
   the processing circuitry is further configured to output the first reliability and the second medical image by applying a second machine learning model to the first medical images; and
   the second machine learning model is trained based on the first medical images, which are inputs, and the second medical image based on the first medical images and the first reliability relating to the second medical image, which are outputs.

6. The medical data processing apparatus according to claim 5, wherein:
   the first medical images as the inputs are a plurality of MR medical images corresponding to a number of excitations in magnetic resonance imaging; and
   the second medical image as part of the outputs is an addition average image or an addition image based on the MR medical images.

7. The medical data processing apparatus according to claim 1, further comprising a display configured to display the second medical image and the first reliability.

8. The medical data processing apparatus according to claim 1, wherein the processing circuitry is further configured to apply a third machine learning model to the second medical image and the first reliability, and output a processing result of image recognition by the third machine learning model for the second medical image and a second reliability relating to the processing result.

9. The medical data processing apparatus according to claim 8, wherein when the image recognition is an organ classification, the second reliability output by the processing circuitry relates to a reliability of a classification result.

10. The medical data processing apparatus according to claim 8, wherein when the image recognition is a disease determination, the second reliability output by the processing circuitry relates to a reliability of a determination result.

11. The medical data processing apparatus according to claim 8, wherein when the second reliability is lower than a threshold value, the processing circuitry is further configured to instruct control circuitry of a magnetic resonance imaging apparatus to perform additional acquisition.

12. A medical image processing apparatus comprising processing circuitry configured to:
  obtain a medical image and a first reliability relating to the medical image; and
  apply a machine learning model that performs image recognition to the medical image and the first reliability, and output a processing result of the image recognition for the medical image and a second reliability relating to the processing result.

13. A medical image processing apparatus, comprising: processing circuitry configured to
  obtain raw data;
  perform iterative reconstruction on the raw data, thereby generating a plurality of medical images, which are intermediate products and/or final products; and
  apply a machine learning model to the generated plurality of medical images, thereby generating one medical image.

* * * * *